US012762449B2

(12) United States Patent
Akiyama et al.

(10) Patent No.: US 12,762,449 B2
(45) Date of Patent: Oct. 13, 2026

(54) QUANTUM CALCULATOR

(71) Applicant: Hitachi, Ltd., Tokyo (JP)

(72) Inventors: Satoru Akiyama, Tokyo (JP); Takeru Utsugi, Tokyo (JP); Yusuke Wachi, Tokyo (JP); Satoshi Muraoka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 899 days.

(21) Appl. No.: 18/115,091

(22) Filed: Feb. 28, 2023

(65) Prior Publication Data

US 2023/0394348 A1 Dec. 7, 2023

(30) Foreign Application Priority Data

Jun. 2, 2022 (JP) ................................. 2022-089990

(51) Int. Cl.

*G06N 10/40* (2022.01)
*G06F 1/20* (2006.01)
*H05K 1/11* (2006.01)
*H05K 1/181* (2026.01)
*H05K 7/20* (2006.01)

(52) U.S. Cl.

CPC ............. *G06N 10/40* (2022.01); *H05K 1/111* (2013.01); *H05K 1/181* (2013.01); *H05K 7/20272* (2013.01)

(58) Field of Classification Search

CPC ........ G06N 10/40; G06N 10/00; G06N 60/80; G06F 1/20; G06F 1/203; G06F 1/206; G06F 1/00; G06F 1/18; H05K 7/20; H05K 7/20354; H05K 7/20272; H05K 7/20363; H05K 7/20281; H05K 1/0201; H05K 1/0203

USPC ................................ 327/512, 524, 527, 528

See application file for complete search history.

(56) References Cited

U.S. PATENT DOCUMENTS 10,757,835 B2 * 8/2020 Ware ......................... G06F 1/20
11,699,837 B2 * 7/2023 Kawaguchi ............... G06F 1/20 327/527
12,367,412 B2 * 7/2025 Harris .................... G06N 10/40
2019/0341173 A1 11/2019 Smith et al.

FOREIGN PATENT DOCUMENTS

JP 2021-523572 A 9/2021

* cited by examiner

*Primary Examiner* — Hai L Nguyen
(74) *Attorney, Agent, or Firm* — MATTINGLY & MALUR, PC

(57) ABSTRACT

The invention addresses providing a technology that enables it to restrain a temperature rise because of current consumed by a quantum semiconductor and wiring conductors for control. A quantum calculator disclosed herein comprises a first refrigeration tube to cool a metal body; a refrigerator framing which encloses inside the metal body and the first refrigeration tube; a quantum bit array chip having a plurality of silicon-spin quantum bits; and multiple control wiring conductors to drive the quantum bit array chip. The quantum bit array chip is placed on the metal body and made up of multiple regions and sub-regions, each of the regions performing a quantum operation independently. The multiple control wiring conductors are connected to the multiple regions and sub-regions respectively as multiple groups of control wiring conductors. The multiple control wring conductors are disposed across the first refrigeration tube.

14 Claims, 9 Drawing Sheets

QUANTUM CALCULATOR

CLAIM OF PRIORITY

The present application claims priority from Japanese Patent Application JP 2022-089990 filed on Jun. 2, 2022, the content of which is hereby incorporated by reference into this application.

BACKGROUND OF THE INVENTION

The present disclosure relates to a quantum calculator and, particularly, to a method in which a quantum semiconductor chip provided to form the quantum calculator is packaged and set up in an arrangement inside the framing of a dilution refrigerator.

Building a quantum computer that can run at a high speed in a cost effective way draws great interest. Quantum computers use superconducting logic-base devices and are typically cooled down at an extremely low temperature so that they will function in a superconducting state. Japanese Unexamined Patent Application Publication (Translation of PCT Application) No. 2021-523572 discloses a system including at least two sets of superconducting logic devices, a cooling device adapted to keep the logic devices cold at a first operating temperature, and an interconnection to link the superconducting logic devices.

SUMMARY OF THE INVENTION

As for quantum semiconductors, their quantum operation of on the order of 1 to 100 quantum bits in an atmosphere at absolute zero temperature which is realized with a dilution refrigerator or the like has so far been demonstrated. However, a system with a medium capacity in the number of quantum bits is insufficient as computer resources to analyze complicated phenomena. On the other hand, an attempt to ensure sufficient computer resources by increasing the capacity as the number of quantum bits more and more poses a problem below: an increase in current consumed by a semiconductor chip and its associated wiring conductors for control due to the quantum operation of a quantum semiconductor causes rise of the temperature of the atmosphere at absolute zero temperature which is a necessary condition for quantum operation.

In Japanese Unexamined Patent Application Publication (Translation of PCT Application) No. 2021-523572, a cryostat that encapsulates a superconducting logic device and is maintained at an operating temperature is described, but there is no disclosure about a method of cooling the superconducting logic device inside the cryostat.

A problem addressed by the present invention is to provide a technology that enables it to restrain a temperature rise because of current consumed by a quantum semiconductor and wiring conductors for control.

Specifically, the temperature of a quantum bit array chip that is a quantum semiconductor and of wring conductors for control is restrained from rising by using means as described below.

A quantum calculator according to one aspect of the present disclosure comprises a first refrigeration tube to cool a metal body, a refrigerator framing which encloses inside the metal body and the first refrigeration tube, a quantum bit array chip having a plurality of silicon-spin quantum bits, and multiple control wiring conductors to drive the quantum bit array chip. The quantum bit array chip is placed on the metal body and made up of multiple regions and sub-regions, each of the regions performing a quantum operation independently. The multiple control wiring conductors are connected to the multiple regions and sub-regions respectively as multiple groups of control wiring conductors. The multiple control wring conductors are disposed across the first refrigeration tube.

When a large-capacity quantum semiconductor is driven to perform a quantum operation, its temperature can be maintained at a temperature that is infinitely close to the absolute zero. Therefore, it is possible to provide a quantum calculator system having high quantum fidelity.

DETAILED DESCRIPTION OF THE PREFERRED EMBODIMENTS

In the following description of embodiments of the invention, an embodiment may divided into plural sections or sub-embodiments, when necessary for convenience sake, and these sections or sub-embodiments are described; unless otherwise specified, they are not independent of each other and they relate to one another such that one is an example of modification, detailed description, supplementary description, etc. of another in part or whole. In the following description of embodiments, where mention is made of the number of elements among others (including the number of pieces, a numeric value, quantity, range, etc.), that number should not be limited to a particular number mentioned and may be more or less than the particular number, unless otherwise specified and unless that number is, in principle, obviously limited to the particular number.

Furthermore, in the following description of embodiments, needless to say, components (including constituent steps or the like) of an embodiment are not always necessary, unless otherwise specified and unless such components are, in principle, considered to be obviously necessary. Likewise, in the following description of embodiments, when mention is made of the shape of a component or the like, a positional relation between components, etc., such mention should be construed to include those that are substantially similar or analogous to the shape or the like, unless otherwise specified and unless such mention is, in principle, considered to be obviously exclusive. This is also true for a numeric value and a range mentioned above.

AN EXAMPLE OF EMBODIMENT

Figure 1:
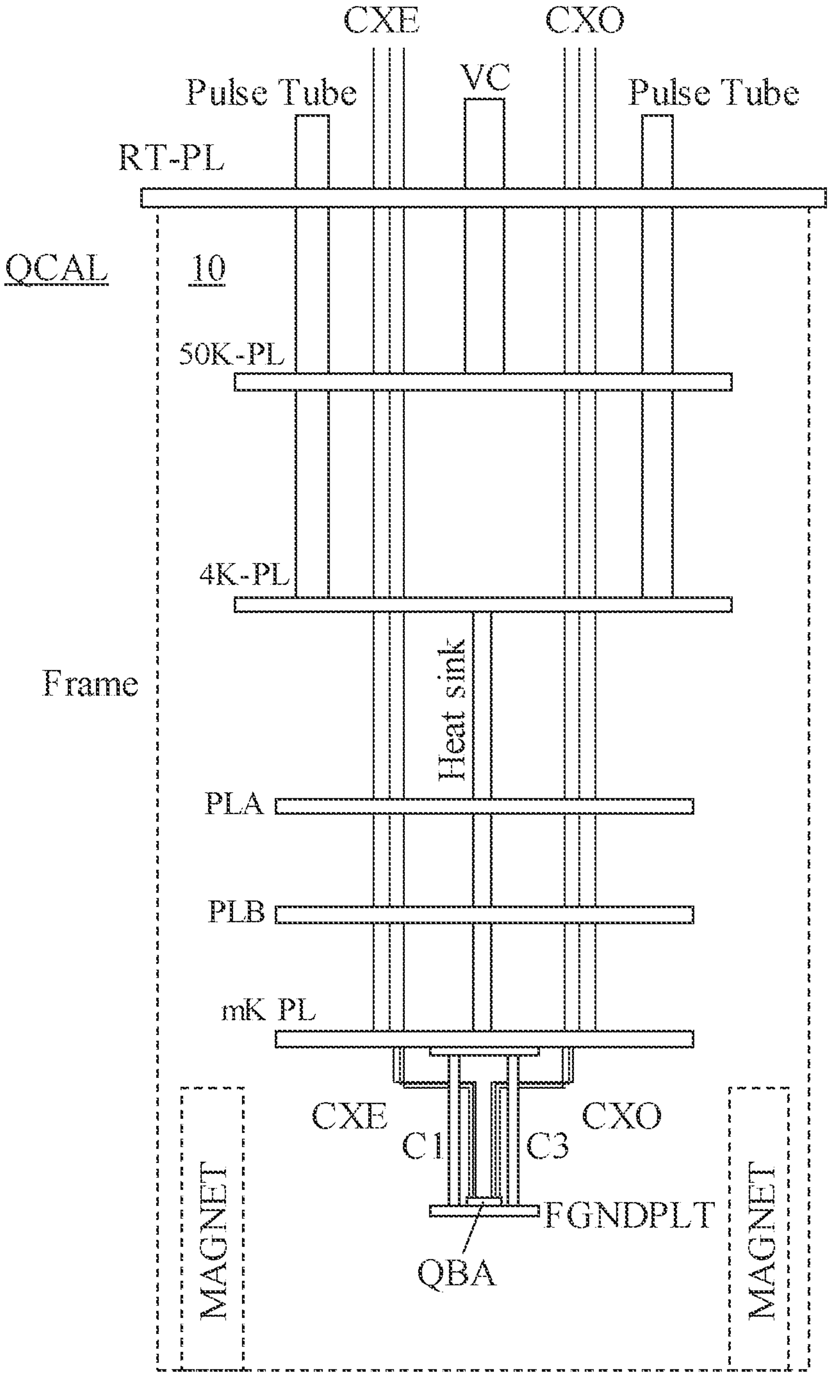
FIG. 1 is a diagram depicting an arrangement and wiring inside a dilution refrigerator in relevance to an example of embodiment.

With FIGS. 1 through 8, explanations are provided for a quantum semiconductor and a method in which it is packaged and set up in an arrangement according to an embodiment of the invention disclosed herein. FIG. 1 is a diagram depicting an arrangement and wiring inside a dilution refrigerator in relevance to an example of embodiment. FIG. 1 illustrates a quantum semiconductor QBA and an arrangement and wiring inside the dilution refrigerator to package and set up the quantum semiconductor QBA in the arrangement.

A quantum calculator QCAL is formed of the quantum semiconductor QBA provided inside the dilution refrigerator 10. The quantum semiconductor QBA can be paraphrased as a silicon quantum bit chip or a quantum bit array chip having a plurality of silicon-spin quantum bits (quantum operational elements qbits).

The dilution refrigerator 10 is isolated by framing Frame and a room temperature plate RT-PL to separate a vacuum atmosphere inside the dilution refrigerator 10 from atmosphere outside the dilution refrigerator 10. A degree of vacuum inside the framing Frame of the dilution refrigerator 10 is controlled by discharging air via a vacuum tube VC through the use of a pump device placed outside the refrigerator 10. Also, control of temperature inside the dilution refrigerator 10 is implemented by circulating diluted liquid helium through pulse tubes PulseTube depicted in FIG. 1. FIG. 1 presents an example in which two pulse tubes PulseTube are connected to the refrigerator. The diluted liquid helium is a product diluted by liquefying two helium isotopes, 3 He and 4 He, and pouring the 3 He phase into the 4 He phase.

In the example of the dilution refrigerator 10 in FIG. 1, a plurality of metal plates (made of principally oxygen-free copper) is disposed and enclosed in the framing Frame of the dilution refrigerator 10; namely, metal plates 50K-PL (put at −223° C.), 4K-PL (put at −269° C.), PLA, PLB, and mKPL (put at about −273° C.). As for the metal plates PLA and PLB, their temperature is controlled between 4K (−269° C.) and mK (about −273° C.). Temperature control is configured to control and keep thermal equilibrium using a heater for temperature control (not depicted) which is mounted on each of the plates (50K-PL, 4K-PL, PLA, PLB, and mKPL) and a temperature controller (not depicted) which is placed outside the dilution refrigerator 10 to control the amount of power input to the heater for temperature control. In the example of FIG. 1, diluted liquid helium is made to circulate from the pulse tubes PulseTube to a heat sink Heatsink. Thereby, the metal plate 4K-PL and the metal plate mKPL with which the heat sink Heatsink is connected are put at an extremely low temperature via the heat sink Heatsink through which diluted liquid helium circulates. Thus, it is possible to realize placing the metal plate 4K-PL and the metal plate mKPL in a cryogenic atmosphere of 10 mK to 100 mK. The heat sink Heatsink and the pulse tubes PulseTube can be termed as a first refrigeration tube and a second refrigeration tube, respectively. Also, the metal plate mKPL and the metal plate 4K-PL can be termed as a first metal plate and a second metal plate, respectively.

The quantum semiconductor QBA is packaged and set up on a first cooling plate FGNDPLT to cool it, located below the metal plate mKPL. The cooling plate FGNDPLT is thermally connected with the metal plate mKPL via cold rods C0 to C3 (however, even-numbered ones C0 and C2 of which are not depicted). Basically, the heat sink Heatsink is a refrigeration tube to cool the cooling plate FGNDPLT that is a metal body with diluted liquid helium. The cooling plate FGNDPLT that is the metal body is thermally connected with the metal plate mKPL via the cold rods C0 to C3.

The reason why the quantum semiconductor QBA is placed below the metal plate mKPL, instead of being packaged and set up in direct contact with the metal plate mKPL, lies in making the quantum semiconductor QBA perform a quantum operation while applying a static magnetic field to the QBA. Magnets MAGNET for generating the static magnetic field are located in a bottom layer of the dilution refrigerator 10. Spatially reasonable placement of the quantum semiconductor QBA as in FIG. 1 was opted in an example of a configuration of the dilution refrigerator 10 in the present example of embodiment. Additionally, electric signals necessary for making the quantum semiconductor QBA perform a quantum operation are output from a controlling device (not depicted) placed outside the refrigerator 10. Among the electric signals, control signals are electrically connected to the quantum semiconductor QBA via coaxial wiring conductor bundles CXE and CXO and a power supply voltage and a power supply current are electrically connected to the quantum semiconductor QBA via twisted wiring conductor bundles for DC, TWE and TWO.

Figure 2:
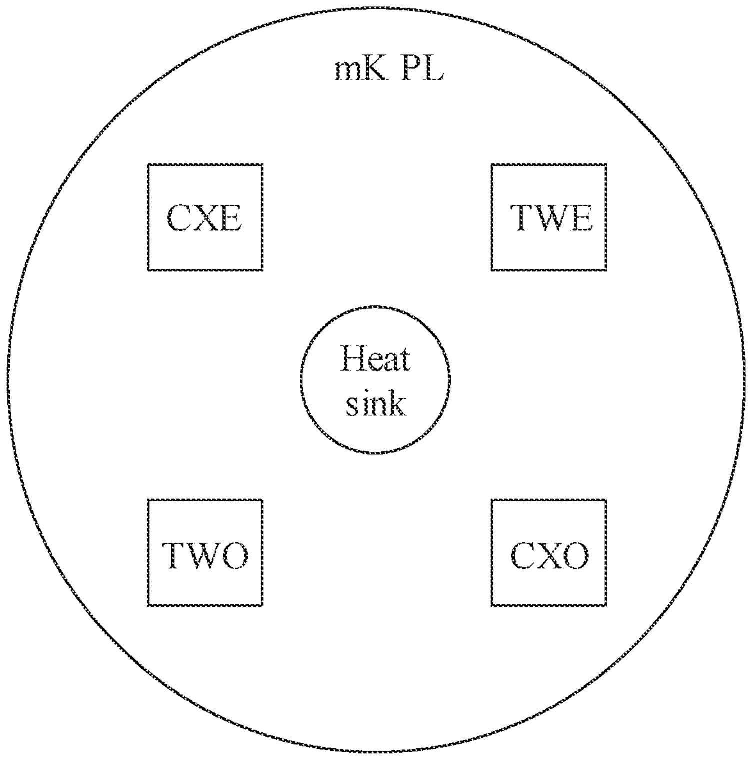
FIG. 2 is a diagram depicting a spatial arrangement of wiring conductors on a cold plate inside the dilution refrigerator in relevance to the example of embodiment.

FIG. 2 is a diagram depicting a spatial arrangement of wiring conductors on a cold plate mKPL inside the dilution refrigerator 10. The shape of the metal plate mKPL that is a cryogenic plate (a cold plate) is a disk shape in a planar view, as in FIG. 2. The heat sink Heatsink for cooling the metal plate mKPL in the order of mK is placed in the center of the metal plate mKPL.

In this example of embodiment, the coaxial wiring conductor bundles CXE and CXO for control are placed in positions opposite each other across the heat sink Heatsink. Likewise, the twisted wiring conductor bundles TWE and TWO for power supply are placed in positions opposite each other across the heat sink Heatsink. Between a coaxial wiring conductor bundle CXE and a coaxial wiring conductor bundle CXO, a twisted wiring conductor bundle TWE or a twisted wiring conductor bundle TWO is placed. The coaxial wiring conductor bundle CXE can be termed as a plurality of first wiring conductors for control and the coaxial wiring conductor bundle CXO can be termed as a plurality of second wiring conductors for control. The twisted wiring conductor bundle TWE can be termed as a plurality of first wiring conductors for power supply and the twisted wiring conductor bundle TWO can be termed as a plurality of second wiring conductors for power supply.

For the quantum semiconductor QBA of the present example of embodiment, these groups of wiring conductor bundles (CXE and CXO, TWE and TWO) are classified into even-numbered conductors and odd-numbered conductors and passage of a desired electric signal and voltage or current is controlled in a time division manner such that odd-numbered and even-numbered conductors become conductive alternately in time units, which will be explained later with FIG. 8. For this reason, for instance, when a control signal and a power supply current are flowing through even-numbered coaxial wiring conductor bundle CXE and twisted wiring conductor bundle TWE, power attenuation in the coaxial wiring conductor bundle CXE and wiring resistance in the twisted wiring conductor bundle TWE give rise to loss in the coaxial wiring conductor bundle CXE and in the twisted wiring conductor bundle TWE. Because the internal space of the dilution refrigerator 10 is a high vacuum environment, an increase in temperature ΔT due to the loss is dissipated by the heat sink Heatsink via each of the wring conductor bundles (CXE, TWE). The above description regarding the even-numbered coaxial wiring conductor bundle CXE and twisted wiring conductor bundle TWE is also true for odd-numbered coaxial wiring conductor bundle CXO and twisted wiring conductor bundle TWO. When a control signal and a power supply current are flowing through the odd-numbered coaxial wiring conductor bundle CXO and twisted wiring conductor bundle TWO, power attenuation in the coaxial wiring conductor bundle CXO and wiring resistance in the twisted wiring conductor bundle TWO give rise to loss in the coaxial wiring conductor bundle CXO and in the twisted wiring conductor bundle TWO. Because the internal space of the dilution refrigerator 10 is a high vacuum environment, an increase in temperature ΔT due to the loss is dissipated by the heat sink Heatsink via each of the wring conductor bundles (CXO, TWO).

Distance between the even-numbered wiring conductor group CXE and the odd-numbered wiring conductor group CXO is longer than distance between the even-numbered wiring conductor group CXE and the heat sink Heatsink. Therefore, an amount of heat generated in the even-numbered wiring conductor group CXE is to be absorbed efficiently by the heat sink Heatsink and it is enabled to repress an increase in temperature of the odd-numbered wiring conductor group CXO depending on the amount of heat generated in the even-numbered wiring conductor group CXE to a sufficiently low level. Likewise, an amount of heat generated in the odd-numbered wiring conductor group CXO is to be absorbed efficiently by the heat sink Heatsink and it is enabled to repress an increase in temperature of the even-numbered wiring conductor group CXE depending on the amount of heat generated in the odd-numbered wiring conductor group CXO to a sufficiently low level. The same effect is also obtained for the twisted wiring conductor bundles (TWE, TWO) (those skilled in the art would easily understand from the above description regarding the coaxial wiring conductor bundles CXE, CXO and, therefore, a detailed description regarding the twisted wiring conductor bundles TWE, TWO is omitted). By combining an arrangement and wiring as above with a time division drive sequence (see FIG. 8), it is possible to control and keep the metal plate mKPL in an atmosphere approximate to absolute zero temperature without upsetting thermal equilibrium inside the dilution refrigerator 10.

Figure 3:
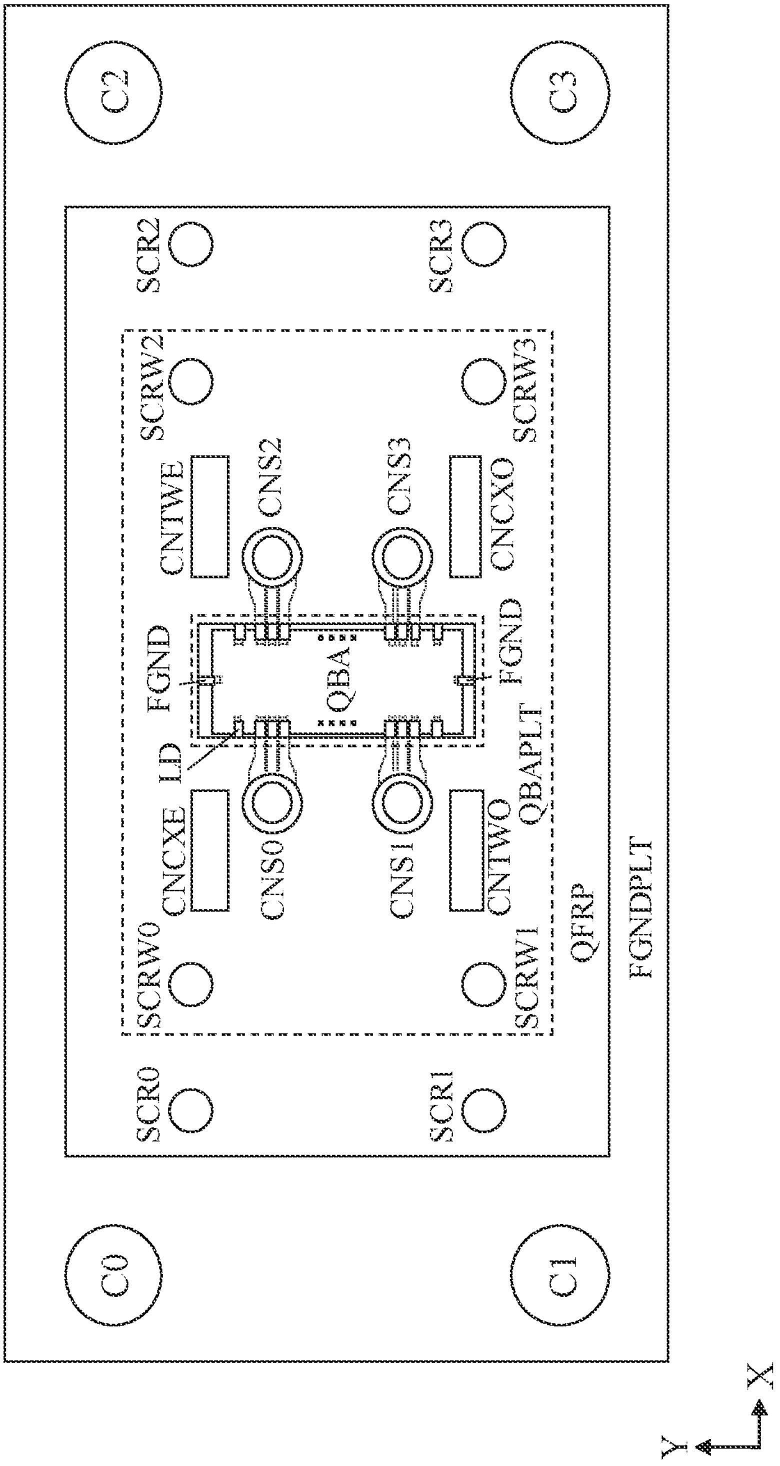
FIG. 3 is a plan view of a quantum semiconductor packaged on a substrate in relevance to the example of embodiment.
Figure 4:
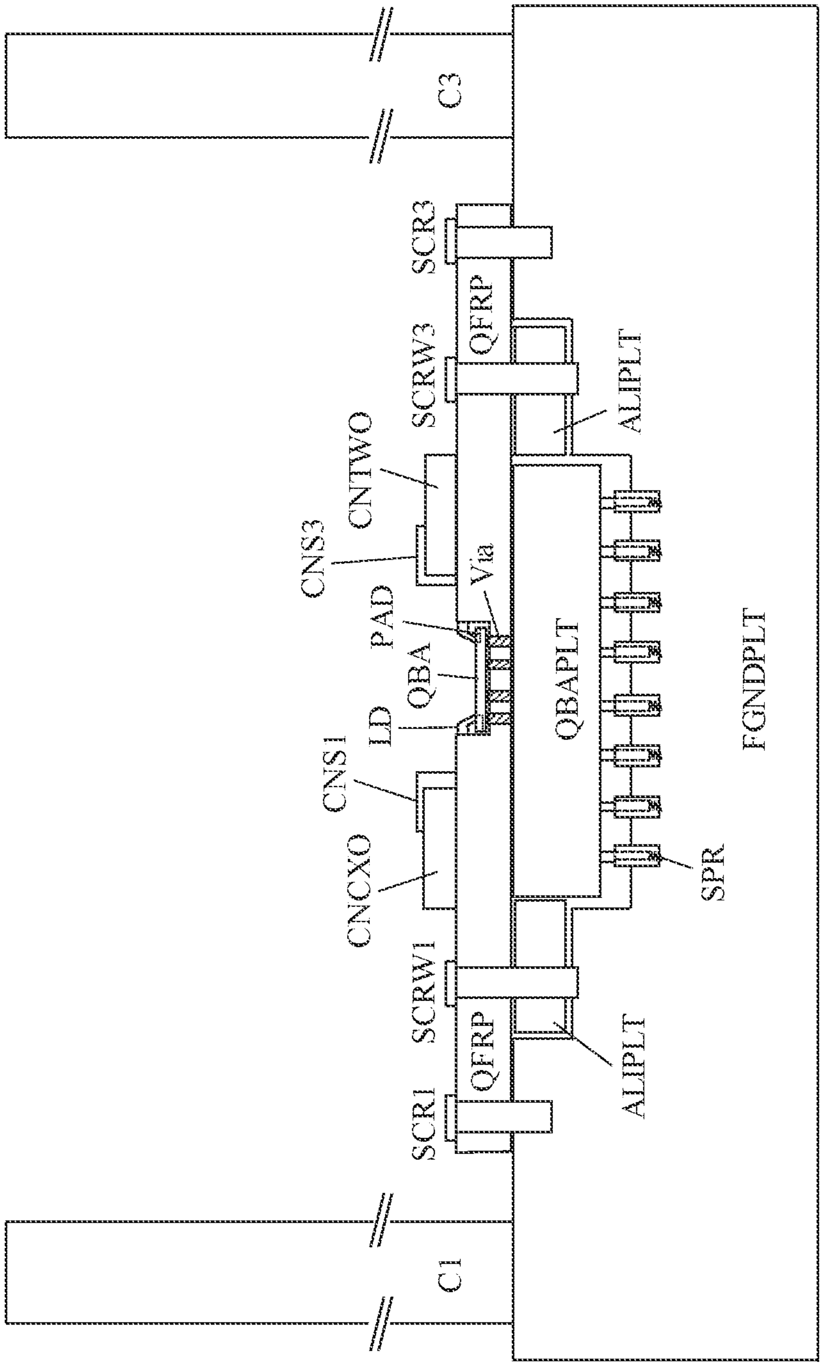
FIG. 4 is a cross-sectional view of the quantum semiconductor packaged on the substrate in relevance to the example of embodiment.

FIG. 3 is a plan view of the quantum semiconductor QBA packaged on a substrate in relevance to the example of embodiment explained with FIG. 1 and FIG. 2. FIG. 4 is a cross-sectional view of the quantum semiconductor QBA packaged on the substrate in relevance to the example of embodiment explained with FIG. 1 and FIG. 2. The quantum semiconductor QBA as a semiconductor chip is mounted on the cooling plate FGNDPLT. The cooling plate FGNDPLT is thermally connected with the metal plate mKPL via four cold rods C1 to C3. A printed substrate QFRP on the cooling plate FGNDPLT is secured onto the cooling plate FGNDPLT using, e.g., non-magnetic screws SCR0 to SCR3. Connectors CNCXE, CNCXO, CNTWE, and CNTWO for connection of the coaxial wiring conductor bundles CXE, CXO and the twisted wiring conductor bundles TWE, TWO to the substrate are electrically connected with the printed substrate QFRP using a solder material or the like. Electric signals that are input to multiple pins internal to the connectors CNCXE, CNCXO, CNTWE, and CNTWO pass through multiple metal wiring patterns made of cupper (Cu) or the like, formed within a multilayer board in the printed substrate QFRP, and are wired to a die bonding area circumjacent to the chip of the quantum semiconductor. The respective multiple pins internal to the connectors CNCXE, CNCXO, CNTWE, and CNTWO are connected with the multiple metal wiring patterns, respectively. The connectors CNCXE, CNCXO, CNTWE, and CNTWO are termed as a first connector, a second connector CNCXO, a third connector CNCXE, and a fourth connector CNTWO.

Additionally, this example of embodiment assumes that GHz order or higher high-frequency signals are applied for control of the quantum semiconductor QBA, there is presented a configuration example in which coaxial connectors CNS0, CNS1, CNS2, and CNS3 for high-frequency wiring conductors are separately mounted on the printed substrate QFRP. The respective pins of the coaxial connectors CNS0, CNS1, CNS2, and CNS3 for high-frequency wiring conductors are also connected with the multiple metal wiring patterns, respectively, formed within the multilayer board in the printed substrate QFRP.

On the printed substrate QFRP, the connectors CNCXE and CNCXO are placed in positions opposite each other across the quantum semiconductor QBA in a planar view. On the printed substrate QFRP, the connectors CNTWE and CNTWO are also placed in positions opposite each other across the quantum semiconductor QBA in a planar view. On the printed substrate QFRP, the connectors CNS0 and CNS1 are placed between the connectors CNCXE and CNTWO. On the printed substrate QFRP, the connectors CNS2 and CNS3 are placed between the connectors CNTWE and CNCXO.

The coaxial wiring conductor bundle CXE is connected to even-numbered arrays QBA-even, which will be described later, of the quantum semiconductor QBA and includes a plurality of wring conductors as follows: a wiring conductor for control input, a wiring conductor for high-frequency signal input, a wiring conductor for outputting a result of a quantum operation, and a wiring conductor for outputting a high-frequency signal among others. Within the coaxial wiring conductor bundle CXE, the wiring conductor for high-frequency signal input is connected to a coaxial connector CNS0 for high-frequency wiring conductors and the wiring conductor for outputting a high-frequency signal is connected to a coaxial connector CNS2 for high-frequency wiring conductors.

Likewise, the coaxial wiring conductor bundle CXO is connected to odd-numbered arrays QBA-odd, which will be described later, of the quantum semiconductor QBA and includes a plurality of wring conductors as follows: a wiring conductor for control input, a wiring conductor for high-frequency signal input, a wiring conductor for outputting a result of a quantum operation, and a wiring conductor for outputting a high-frequency signal among others. Within the coaxial wiring conductor bundle CXO, the wiring conductor for high-frequency signal input is connected to a coaxial connector CNS1 for high-frequency wiring conductor and the wiring conductor for outputting a high-frequency signal is connected to a coaxial connector CNS3 for high-frequency wiring conductor.

After applying a solder material or silver paste onto the back surface of the quantum semiconductor QBA chip, the chip is bonded to the die bonding area defined in an internal recess in the printed substrate QFRP using a reflow device. Metal pads (also, called aluminum PADs) that are electrodes on the quantum semiconductor QBA chip are electrically and thermally connected with the Cu patterns on the printed substrate QFRP using metal lead frames (hereinafter referred to as metal leads) LD which are created in place in the printed substrate QFRP. Cooling pads FGND that are electrodes on the quantum semiconductor QBA chip are electrically and thermally connected with a cooling plate QBAPLT of metal (made of principally oxygen-free copper) using the metal leads LD. Ground potential is applied to the cooling pads FGND. The metal leads LD are electrically and thermally connected with the aluminum pads PAD which are formed on the quantum semiconductor QBA chip by applying a certain torque to the non-magnetic screws SCRW0 to SCRW 3. Besides, a plurality of through holes (through vias) Via is formed in the printed substrate QFRP within a region of the back surface of the quantum semiconductor QBA. Thereby, ground potential of the back surface of the quantum semiconductor QBA chip is electrically and thermally connected to the cooling plate (second cooling plate) QBAPLT via the through vias Via.

By the way, when the metal plate mKPL is placed in the cryogenic atmosphere, metal plates such as the cooling plate (first cooling plate) FGNDPLT and the cooling plate QBAPLT and a resin layer of the printed substrate QFRP contract at a constant rate. Because temperature dependence of a shrinkage factor differs from material to material, there is a possibility of a physical separation between a metal lead LD and an aluminum PAD on the quantum semiconductor QBA chip depending on the situation, resulting in electrical and thermal disconnection.

To prevent this trouble, metal pins SPR having a spring structure are placed between both the cooling plates QBAPLT and FGNDPLT in the present example of embodiment. Also, alignment plates ALIPLT to adjust the positions of the cooling plates QBAPLT and FGNDPLT are provided to cover outer peripheries of the cooling plate QBAPLT. Note that the alignment plates ALIPLT are excluded from the plan view of FIG. 3 to prevent complicity of depiction. These structural members are useful as follows. When the metal plate mKPL has been cooled from a room temperature to an extremely low temperature, distance between the cooling plates QBAPLT and FGNDPLT tend to grow. Extension of the metal pins SPR works to close the above distance so that contacts between the metal leads LD and the aluminum pads PD will not be lost. Structural arrangements so far described enable it to efficiently cool the quantum semiconductor QBA chip from its surfaces.

Although not mentioned before, the quantum semiconductor QBA chip is formed using silicon semiconductors. It is known that thermal conductivity of silicon becomes very smaller than metal in extremely low temperature conditions. Hence, there is a possibility that it becomes hard to dissipate heat from the back surface (Si sub) of the quantum semiconductor QBA chip. Even in such a case, use of the structural arrangements of the present example of embodiment enables it to provide heat dissipation paths from both front and back surfaces of the quantum semiconductor QBA and such an effect is obtained that extremely low temperature conditions necessary for a quantum operation can be maintained.

Figure 5A:
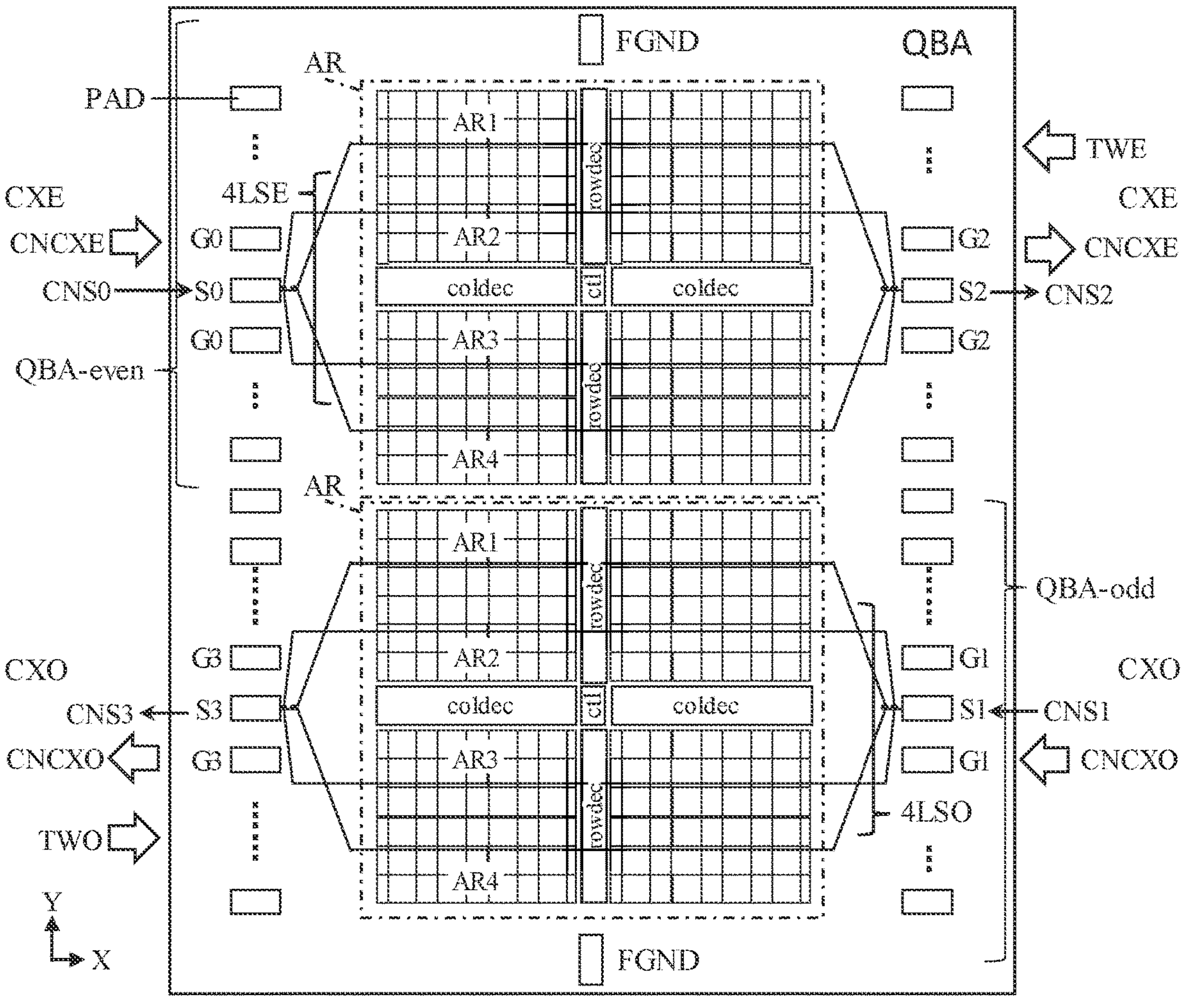
FIG. 5A is a diagram depicting a layout of the quantum semiconductor in relevance to the example of embodiment.
Figure 5B:
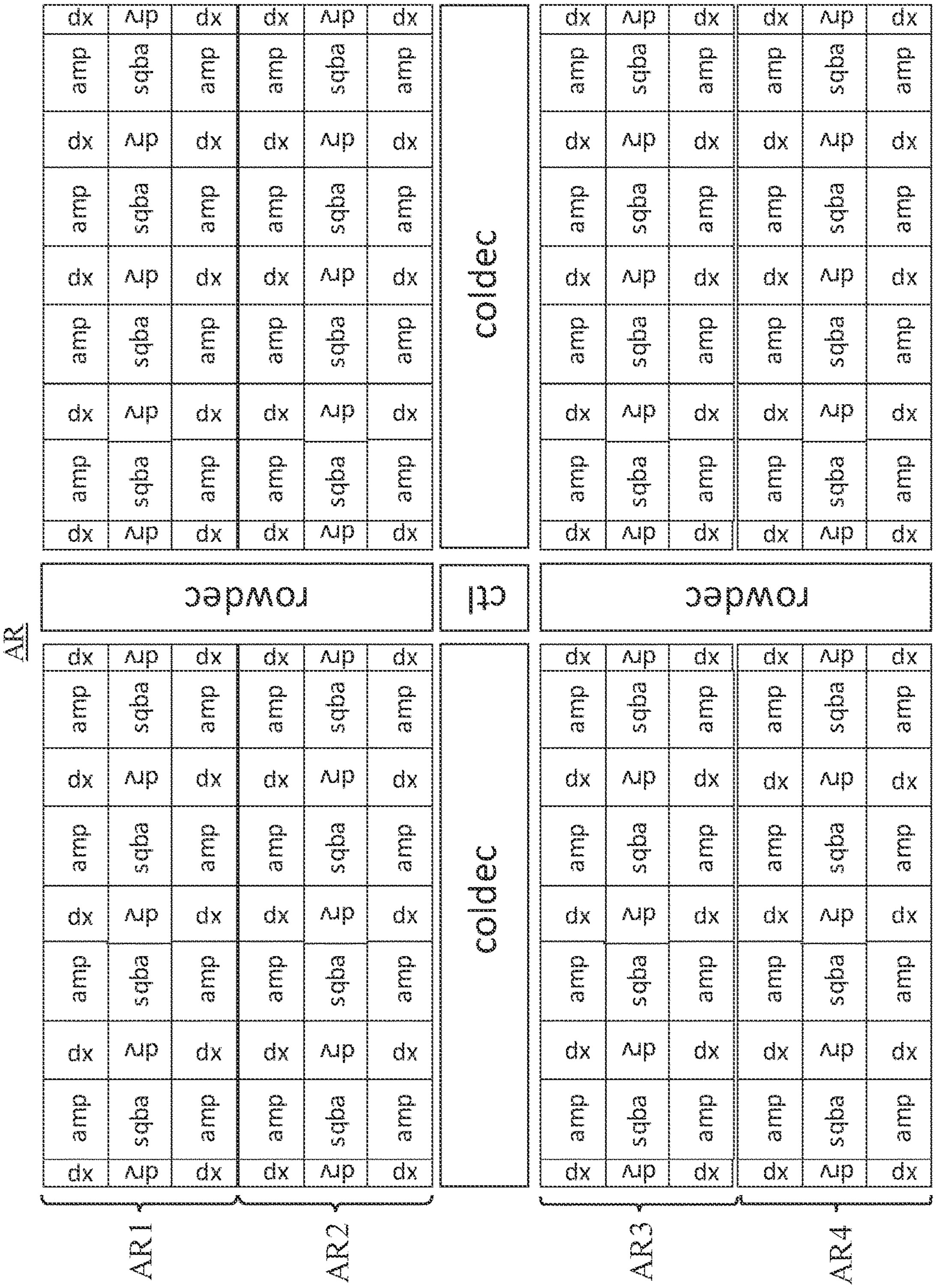
FIG. 5B is an enlarged view of an array region AR in FIG. 5A.

FIG. 5A is a diagram depicting a layout of the quantum semiconductor QBA chip of the present example of embodiment. FIG. 5B is an enlarged view of an array region AR in FIG. 5A. Because a layout structure of an array region AR in a core part is completed, its enlarged view is presented in FIG. 5B. The core part of the quantum semiconductor QBA chip includes two array regions AR and each array region AR is comprised of an element group sqba which performs a quantum operation, a driver circuit unit drv to drive the element group, a read-out signal amplifier unit amp, a control circuit unit xp, a row decoder rowdec, a column decoder coldec, a control circuit group ctl, etc. Also, in outermost edges of the quantum semiconductor QBA chip, there is arranged a plurality of aluminum pads (FGND, G0, G1, G2, G3, S0, S1, S2, S3, etc.).

A control signal, a voltage, and a current that have been input from a measuring device outside the dilution refrigerator 10 pass via the coaxial wiring conductor bundles (CXE, CXO) and the twisted wiring conductor bundles (TWE, TWO), their connectors (CNCXE, CMCXO, CXTWE, CMTWO, CNS0, CNS1, CNS2, CNS3), and the Cu wiring patterns within the printed substrate QFRP and are conveyed from the aluminum pads PAD to respective control circuits in the core part of the quantum semiconductor QBA chip.

The quantum semiconductor QBA chip is placed on the metal body FGNDPLT and made up of multiple regions and sub-regions, each of the regions performing a quantum operation independently. In this example, the quantum semiconductor QBA chip is logically divided into two parts: a first region of an even-numbered array QBA-even and a second region of an odd-numbered array QBA-odd. The first region of the even-numbered array QBA-even and the second region of the odd-numbered array QBA-odd are made to perform a quantum operation independently in a time division manner. In other words, the core part of the quantum semiconductor QBA chip is logically divided into two parts: the even-numbered array QBA-even (which corresponds to an upper array region AR in FIG. 5A) and the odd-numbered array QBA-odd (which corresponds to a lower array region AR in FIG. 5A). In this sense, the quantum semiconductor QBA chip is called a quantum bit array chip.

In the case of a quantum manipulation of the quantum semiconductor QBA, the quantum manipulation may be carried out with electromagnetic waves that are generated by inputting high-frequency signals. When passing through the regions (odd-numbered array QBA-odd and even-numbered array QBA-even) that are made to operate independently, the high-frequency signals are made to pass in opposite directions for each region.

A structural arrangement in this regard is explained below. For example, suppose that a high-frequency signal for the even-numbered array QBA-even is input to S0, an aluminum pad PAD for signals (S0 is connected to a wiring conductor for high-frequency signal input at the coaxial connector CNS0 for high-frequency wiring conductors). There is a plurality of element groups sqba that are made to operate with high-frequency signals (each region AR has four sub-regions AR1, AR2, AR3, and AR4 in the example of FIG. 5A). Therefore, the high-frequency signal at S0 is branched into four paths by an even-numbered control wiring conductor group 4LSE comprised of four control wiring conductors, while passing from S0, the aluminum pad PAD for signals at left in FIG. 5A, to S2, an aluminum pad PAD for signals at right (S2 is connected to a wiring conductor for outputting a high-frequency signal at the coaxial connector CNS2 for high-frequency wiring conductors). Namely, a quantum operation in the even-numbered array QBA-even is carried out with a high-frequency signal routed to pass through the array from left to right in FIG. 5A.

Upon termination of the quantum operation of the element groups in the even-numbered array QBA-even, a high-frequency signal for the odd-numbered array QBA-odd is input to S1, an aluminum pad PAD for signals (S1 is connected to a wiring conductor for high-frequency signal input at the coaxial connector CNS1 for high-frequency wiring conductors). The high-frequency signal from S1 is branched into four paths by an odd-numbered control wiring conductor group 4LSO comprised of four control wiring conductors so as to be routed to sub-regions AR1, AR2, AR3, and AR4 and transmitted to S3, an aluminum pad PAD for signals (S3 is connected to a wiring conductor for outputting a high-frequency signal at the coaxial connector CNS3 for high-frequency wiring conductors), thus making the element groups sqba in the odd-numbered array QBA-odd perform a quantum operation. Namely, the quantum operation in the odd-numbered array QBA-odd is carried out with a high-frequency signal routed to pass through the array from right to left in FIG. 5A in a direction opposite to the direction of a high-frequency signal for the even-numbered array QBA-even.

By control as explained above, two arrays, the even-numbered array QBA-even and the odd-numbered array QBA-odd, into which the QBA chip is divided, will generate heat alternately. Consequently, the element groups sqba in the even-numbered array QBA-even and the element groups sqba in the odd-numbered array QBA-odd are less susceptible to mutual heat generation and an effect of repressing an increase in their temperature is obtained. In FIG. 5A, ground potential is supplied to G0, G1, G2, and G3, aluminum pads PAD, to shield each high-frequency signal.

Although explanations with instances in which a high-frequency signal is input to S0 and S1, aluminum pads PAD for signals, are given above, multiple control wiring conductors of the coaxial wiring conductor bundle CXE are likewise connected to the respective element groups sqba in the sub-regions AR1, AR2, AR3, and AR4 of the even-numbered array QBA-even by the even-numbered control wiring conductor group comprised of four control wiring conductors via an aluminum pad PAD. Multiple control wiring conductors of the coaxial wiring conductor bundle CXO are likewise connected to the respective element groups sqba in the sub-regions AR1, AR2, AR3, and AR4 of the odd-numbered array QBA-odd by the odd-numbered control wiring conductor group comprised of four control wiring conductors via an aluminum pad PAD.

Figure 6:
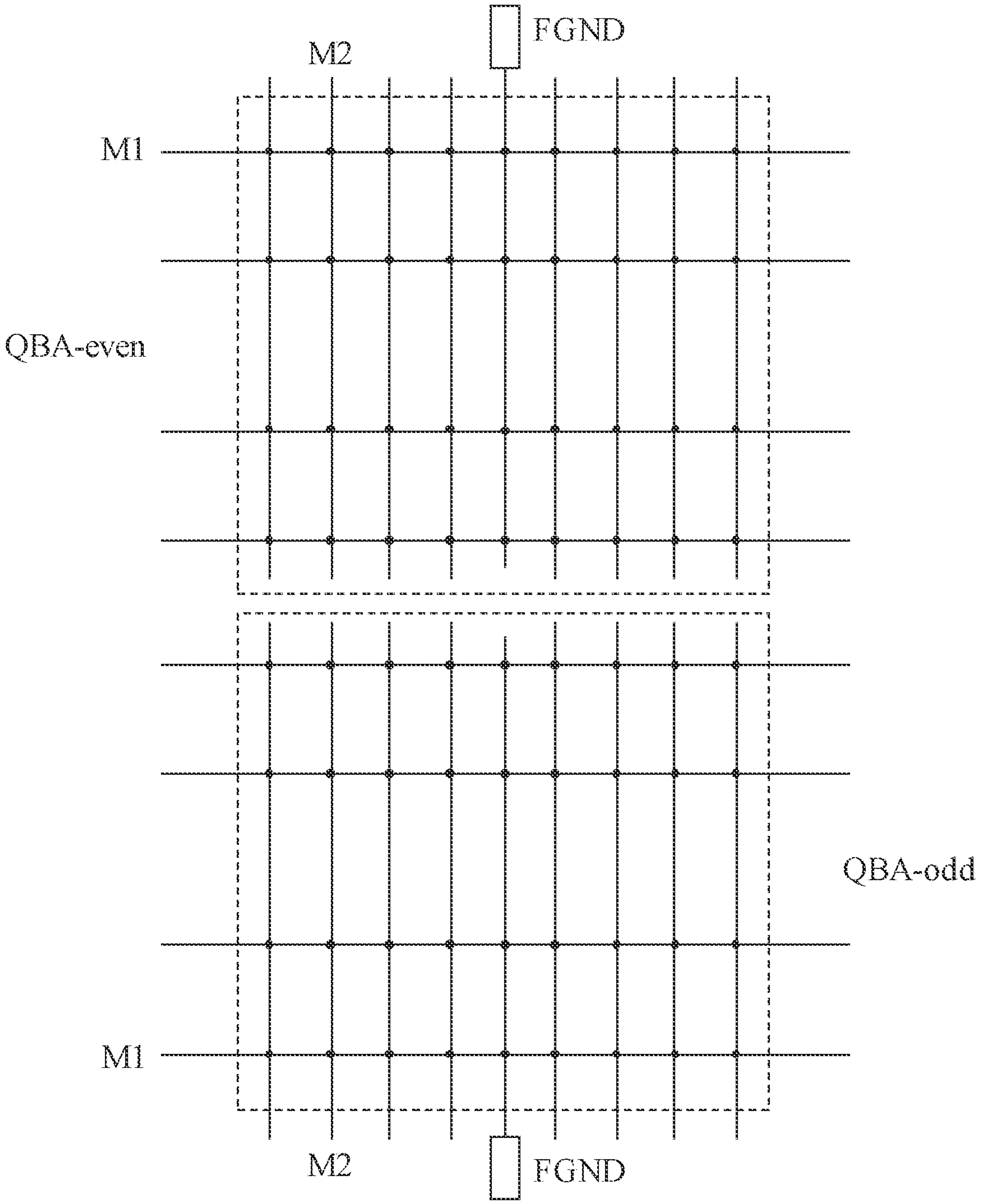
FIG. 6 is a diagram depicting a cooling wiring layout internal to the quantum semiconductor chip in relevance to the example of embodiment.

FIG. 6 is a diagram depicting a cooling wiring layout internal to the quantum semiconductor QBA. The cooling pads FGND are thermally connected with the cooling plate QBAPLT. Also, as is depicted in FIG. 6, the cooling pads FGND are connected across aluminum wiring conductors in the top layer in the wiring structure of the quantum semiconductor QBA to first metal wiring conductors M1 and second metal wiring conductors M2 which are metal (e.g., Cu) wiring conductors in lower layers through contact vias or the like. The first metal wiring conductors M1 and the second metal wiring conductors M2 can be considered as wiring conductors dedicated to cool a plurality of quantum bits in the quantum semiconductor QBA.

The first metal wiring conductors M1 and the second metal wiring conductors M2 are placed and wired in a mesh arrangement internal to the quantum semiconductor QBA. In this regard, the meshed wiring of the first and second metal wiring conductors M1 and M2 should preferably be placed and wired to make a thermal separation between the even-numbered array QBA-even and the odd-numbered array QBA-odd of the quantum semiconductor QBA chip. Specifically, the quantum semiconductor QBA chip is internally provided with first dedicated wiring conductors (M1, M2) to cool the silicon-spin quantum bits, solely disposed in the even-numbered array QBA-even, and second dedicated wiring conductors (M1, M2) to cool the silicon-spin quantum bits, solely disposed in the odd-numbered array QBA-odd. The first dedicated wiring conductors (M1, M2) and the second dedicated wiring conductors (M1, M2) are thermally separated from each other.

This is because this yields an effect of preventing an amount of heat generated by the element groups sqba in the even-numbered array QBA-even from being transferred to the element groups sqba in the odd-numbered array QBA-odd through the metal wiring conductors M1 and M2. Because an amount of heat generated in the even-numbered array QBA-even is hardly transferred to the odd-numbered array QBA-odd, an increase in temperature of the element groups sqba in the odd-numbered array QBA-odd is repressed and it would become possible to continue a stable quantum operation in a time division manner. Likewise, an amount of heat generated in the odd-numbered array QBA-odd is hardly transferred to the even-numbered array QBA-even. Therefore, an increase in temperature of the element groups sqba in the even-numbered array QBA-even is repressed and it would become possible to continue a stable quantum operation in a time division manner.

Figure 7:
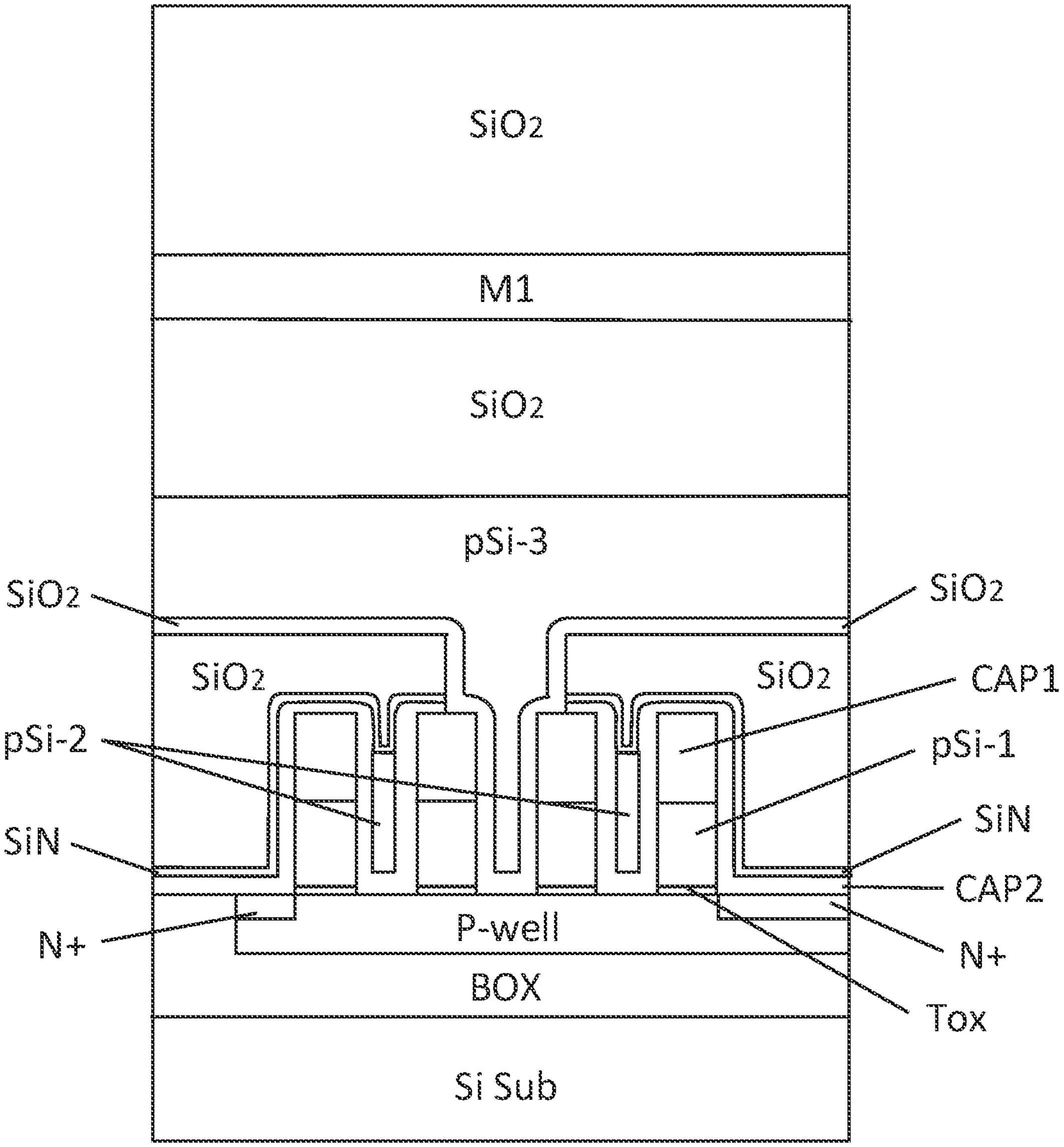
FIG. 7 is a cross-sectional view of the quantum semiconductor chip in relevance to the example of embodiment.

FIG. 7 is a cross-sectional view of the quantum semiconductor QBA chip of the present example of embodiment. Presented is a so-called fully depleted silicon CMOS semiconductor in which an oxide film layer BOX is formed on top of the silicon substrate Sisub and an activation layer p-well to create quantum operational elements qbits is formed on top of the oxide film layer BOX. Transistors for making the quantum operational elements qbits work in quantum mechanics are comprised of sets of polysilicon pSi-1 and a gate insulating film Tox beneath pSi-1. Other symbols are as follow: N+ is a high density diffusion layer region; CAP1, CAP2, SiN, and SiO2 are interlayer films; pSi-2 and pSi-3 are polysilicon wiring layers for control; and M1 is a metal wiring layer. When a quantum operation is performed, current and voltage are applied to each polysilicon wiring layer pSi-2, pSi-3. It follows that polysilicon wiring resistance gives rise to loss and the quantum operational elements qbits generate heat. In the structural arrangements of the present embodiment, the metal wiring conductors M1 that are cooled sufficiently are placed and wired to a position close to the polysilicon wiring layer pSi1, pSi-3. Therefore, generated loss (heat) can be dissipated out of the quantum semiconductor QBA chip efficiently.

Figure 8:
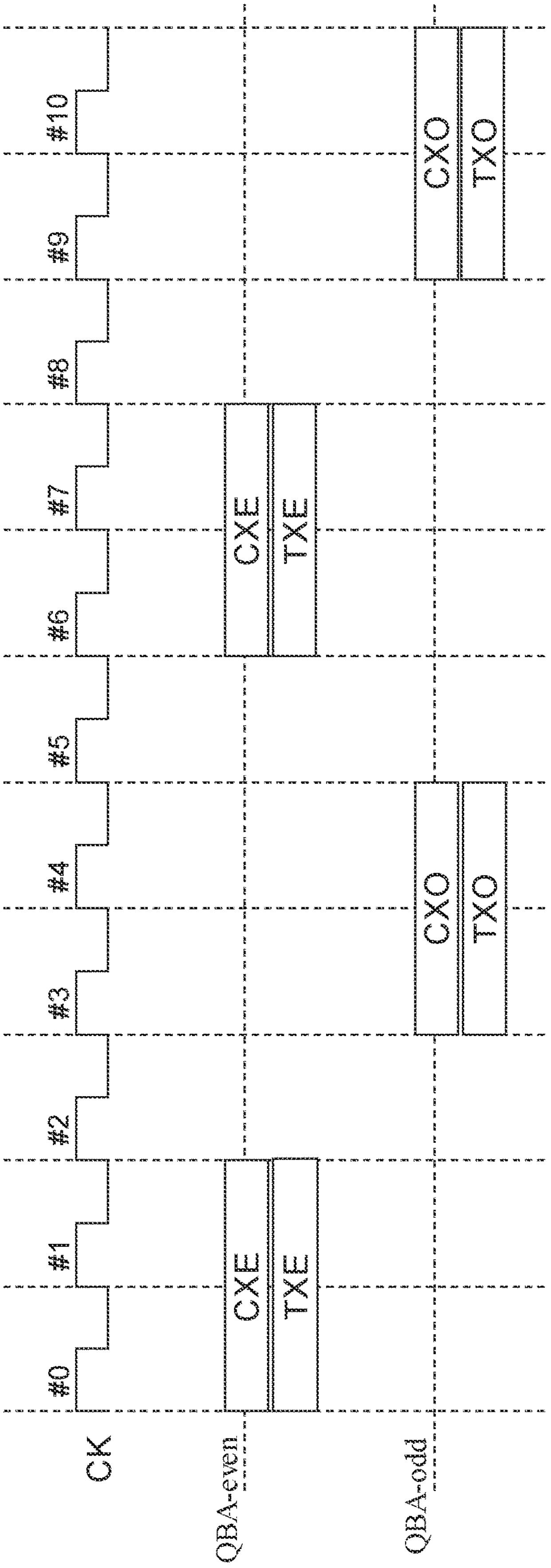
FIG. 8 is a diagram representing a sequence of driving the quantum semiconductor chip in relevance to the example of embodiment.

FIG. 8 is a diagram representing a sequence of driving the quantum semiconductor QBA chip. As so far described, the quantum semiconductor QBA chip is divided into two parts: the even-numbered array QBA-even and the odd-numbered array QBA-odd. The even-numbered array QBA-even is first activated to perform a quantum operation and, after termination of its operation, the odd-numbered array QBA-odd is activated to perform a quantum operation. Namely, in this example, the even-numbered array QBA-even and the odd-numbered array QBA-odd which are the multiple regions are caused to operate alternately in a time division manner.

In this example, the even-numbered array QBA-even performs a quantum operation during a period of #0-#1 and a period of #6-#7 of clock CK based on a signal for control from the coaxial wiring conductor bundle CXE and a power supply current from the twisted wiring conductor bundle TWE. Besides, the odd-numbered array QBA-odd performs a quantum operation during a period of #3-#4 and a period of #9-#10 of clock CK based on a signal for control from the coaxial wiring conductor bundle CXO and a power supply current from the twisted wiring conductor bundle TWO. By control as explained above, the coaxial wiring conductor bundles CXE and CXO placed and wired in the dilution refrigerator 10 are also driven in a time division manner, as is presented in FIG. 8. In this consequence, it is enabled to efficiently dissipate loss (heat) that is generated inside the dilution refrigerator 10 out of the dilution refrigerator 10. Besides, by making alignment among arrangements and wiring inside the refrigerator 10, a divisional layout of circuit blocks internal to the semiconductor QBA chip (even-numbered array QBA-even and the odd-numbered array QBA-odd; see FIGS. 5A and 5B), and the locations of, inter alia, the connectors (CNCXE, CNCXO, CNTWE, and CNTWO; see FIG. 3), it is possible minimize the distance of the wiring length of the wiring conductor bundles (CXE, CXO, TWE, and TWO) in the arrangements without crossing and it is enabled to minimize loss that is generated in the wiring conductor bundles (CXE, CXO, TWE, and TWO).

The structural arrangements explained in the foregoing embodiment of example make it possible to maintain the temperature of a large-capacity quantum semiconductor, when it is driven to perform a quantum operation, at a temperature that is infinitely close to the absolute zero. Therefore, it is possible to provide a quantum calculator system having high quantum fidelity.

While the invention developed by the present inventors has been explained specifically hereinbefore based on an embodiment of the invention; needless to say, the invention is not limited to the foregoing embodiment and may be modified in various ways without departing from the scope of the invention.

The foregoing embodiment is described in detail to explain the present invention to make it easy to understand and the invention is not necessarily limited to an embodiment including all components described. Besides, for a subset of the components of an embodiment, other components may be added to the subset or the subset may be removed or replaced by other components.

Besides, while the foregoing embodiment is described, assuming a case where a silicon quantum semiconductor is used, the present invention is not limited to this case of application and can also be applied to a superconducting quantum semiconductor or the like.

REFERENCE SIGNS LIST

QCAL: quantum calculator, 10: dilution refrigerator, QBA: quantum semiconductor QBA, qbit: quantum operational element, Frame: framing, RT-PL: room temperature plate, VC: vacuum tube, PulseTube: pulse tube, 50K-PL, 4K-PL, PLA, PLB, mKPL: metal plates, FGNDPLT: first cooling plate (metal body), Heatsink: heat sink (first refrigeration tube), MAGNET: magnet, CXE, CXO: coaxial wiring conductor bundles, TWE, TWO: twisted wiring conductor bundles, C1 to C3, cold rods, QFRP: printed substrate, CNCXE, CNCXO, CNTWE, CNTWO: connector, CNS0, CNS1, CNS2, CNS3: coaxial connectors for high-frequency wiring conductors, QBA-even: even-numbered array, QBA-odd: odd-numbered array, QBAPLT: second cooling plate, LD: metal lead, PAD: aluminum pads, ALIPLT: alignment plate, SPR: metal pins, sqba: element group, drv: driver circuit unit, amp: read-out signal amplifier unit, xp: control circuit unit, rowdec: row decoder, coldec: column decoder, ctl: control circuit group, M1, M2: metal wiring conductors

What is claimed is:

1. A quantum calculator comprising:

a first refrigeration tube to cool a metal body;

a refrigerator framing which encloses inside the metal body and the first refrigeration tube;

a quantum bit array chip having a plurality of silicon-spin quantum bits; and multiple control wiring conductors to drive the quantum bit array chip, wherein the quantum bit array chip is placed on the metal body and made up of multiple regions and sub-regions, each of the regions performing a quantum operation independently;

the multiple control wiring conductors are connected to the multiple regions and sub-regions respectively as multiple groups of control wiring conductors; and the multiple control wring conductors are disposed across the first refrigeration tube.

2. The quantum calculator according to claim 1 further comprising a first metal plate having a disk shape in a planar view, enclosed in the refrigerator framing, wherein the first refrigeration tube is placed in a center of the first metal plate in a top view;

the multiple control wiring conductors comprise a plurality of first wiring conductors for control and a plurality of second wiring conductors for control;

the plurality of first wiring conductors for control and the plurality of second wiring conductors for control are placed in positions opposite each other across the first refrigeration tube on the first metal plate in a top view.

3. The quantum calculator according to claim 2, further comprising a plurality of first wiring conductors for power supply and a plurality of second wiring conductors for power supply to supply a power supply voltage to each of the multiple regions and sub-regions, wherein the plurality of first wiring conductors for power supply and the plurality of second wiring conductors for power supply are placed in positions opposite each other across the first refrigeration tube on the first metal plate in a top view.

4. The quantum calculator according to claim 3, further comprising:

a second refrigeration tube from and through which diluted liquid helium is circulated; and a second metal plate which is cooled by the second refrigeration tube, enclosed in the refrigerator framing, wherein the first refrigeration tube is disposed between the second metal plate and the first metal plate and the liquid helium is circulated through the first refrigeration tube to cool the first metal plate to an extremely low temperature.

5. The quantum calculator according to claim 3, further comprising:

a substrate over which the quantum bit array chip is packaged; and a plurality of connectors for connection which is placed on the substrate and to which the multiple control wiring conductors are connected, wherein the plurality of connectors for connection as much as the multiple regions and sub-regions is placed on the substrate; and each half of the plurality of connectors for connection is placed in positions opposite each other across the quantum bit array chip in a planar view.

6. The quantum calculator according to claim 5, wherein the plurality of connectors for connection comprises a first connector to which the plurality of first wiring conductors for control is connected and a second connector to which the plurality of second wiring conductors for control is connected;

the plurality of connectors for connection further comprises a third connector to which the plurality of first wiring conductors for power supply is connected and a fourth connector to which the plurality of second wiring conductors for power supply is connected;

the first connector and the second connector are placed in positions opposite each other across the quantum bit array chip on the substrate; and the third connector and the fourth connector are placed in positions opposite each other across the quantum bit array chip on the substrate.

7. The quantum calculator according to claim 6, wherein the substrate comprises multi-layer metal wiring patterns;

each of the multi-layer metal wiring patterns is connected to multiple pins of the first connector and the second connector;

the substrate further comprises a plurality of metal frames joined with the wiring patterns on the substrate;

a plurality of metal pads on the quantum bit array chip is electrically connected with the plurality of metal frames.

8. The quantum calculator according to claim 6, wherein the substrate and the quantum bit array chip are thermally connected with each other via the metal frames joined with the substrate and the metal pads on the quantum bit array chip;

The metal pads making a thermal connection between the substrate and the quantum bit array chip have dedicated wiring conductors to cool the silicon-spin quantum bits, solely disposed in each of the multiple regions of the quantum bit array chip.

9. The quantum calculator according to claim 2, further comprising a substrate over which the quantum bit array chip is packaged, wherein the metal body includes:

a first cooling plate thermally connected with the first metal plate;

a second cooling plate electrically and thermally connected with a back surface of the quantum bit array chip via a plurality of through holes provided in the substrate; and a plurality of metal pins having a spring structure provided between the first cooling plate and the second cooling plate.

10. The quantum calculator according to claim 9, further comprising a plurality of cold rods which makes a thermal connection between the first metal plate and the first cooling plate.

11. The quantum calculator according to claim 9, wherein the metal body further comprises an alignment plate provided to cover peripheries of the second cooling plate in order to adjust the positions of the first cooling plate and second cooling plate.

12. The quantum calculator according to claim 11, further comprising a magnet which makes the quantum bit array chip perform a quantum operation while applying a static magnetic field to the chip.

13. The quantum calculator according to claim 1, wherein the multiple control wiring conductors comprise a plurality of high-frequency wiring conductors to input high-frequency signals to the quantum bit array chip;

a quantum manipulation of the quantum bit array chip is carried out with electromagnetic waves that are generated by inputting the high-frequency signals; and when passing through the multiple regions that are made to operate independently in the quantum bit array chip, the high-frequency signals are made to pass in opposite directions for each region.

14. The quantum calculator according to claim 1, wherein the quantum bit array chip causes the multiple regions to operate alternately in a time division manner.

* * * * *